United States Patent [19]
Yim et al.

[11] Patent Number: 5,627,624
[45] Date of Patent: *May 6, 1997

[54] INTEGRATED CIRCUIT TEST RETICLE AND ALIGNMENT MARK OPTIMIZATION METHOD

[75] Inventors: Randy Yim, Pleasanton; Christopher Neville, Sunnyvale, both of Calif.

[73] Assignee: LSI Logic Corporation, Milpitas, Calif.

[*] Notice: The term of this patent shall not extend beyond the expiration date of Pat. No. 5,329,334.

[21] Appl. No.: 302,598

[22] Filed: Oct. 31, 1994

[51] Int. Cl.⁶ .......................... G03B 27/42; G03B 27/32; G01B 11/00; G03F 9/00
[52] U.S. Cl. .............................. 355/53; 355/77; 356/401; 430/22
[58] Field of Search .................. 355/53, 77; 356/399, 356/400, 401; 430/22

[56] References Cited

U.S. PATENT DOCUMENTS

| | | |
|---|---|---|
| 4,963,924 | 10/1990 | Gill et al. ............................ 355/53 |
| 5,049,925 | 9/1991 | Aiton et al. ......................... 355/53 |
| 5,250,983 | 10/1993 | Yamamura ......................... 355/53 |
| 5,329,334 | 7/1994 | Yim et al. .......................... 355/53 |
| 5,408,083 | 4/1995 | Hirukawa et al. ................ 250/201.2 |
| 5,440,394 | 8/1995 | Nose et al. ........................ 356/384 |

Primary Examiner—Arthur T. Grimley
Assistant Examiner—David A. Lane
Attorney, Agent, or Firm—Poms, Smith, Lande & Rose

[57] ABSTRACT

A test reticle and alignment mark optimization method is provided for determining the optimal alignment mark size for the efficient and accurate alignment of process layers during integrated circuit manufacture. The test reticle includes a number of orthogonally arranged alignment marks of various types and sizes and one or more registration structures. The method involves the steps of determining an initial expected range of alignment mark sizes on the test reticle which are suitable for a particular application; applying the test reticle patter to test wafers; further processing the test wafers; measuring the alignment signals produced by scanning the alignment marks in the initial expected range; quantifying the alignment signal quality; and fitting the quantified alignment signal quality to a statistical model to determine a range of optimal alignment signal dimensions.

21 Claims, 8 Drawing Sheets

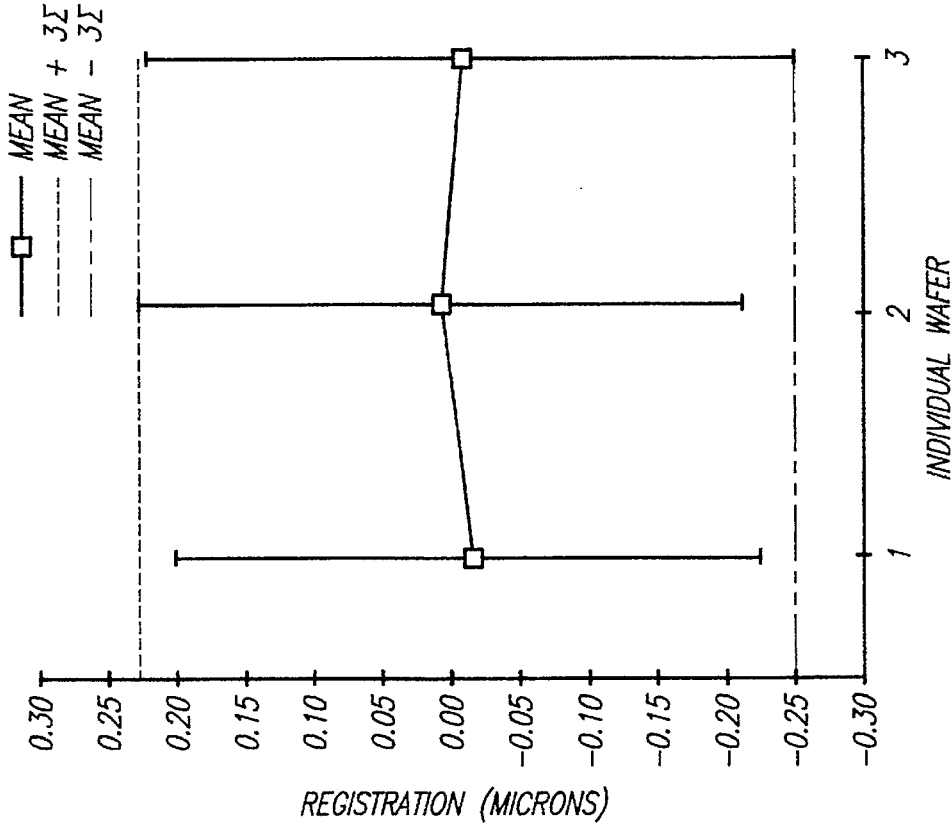
FIG. 7b  NOMINAL LSA
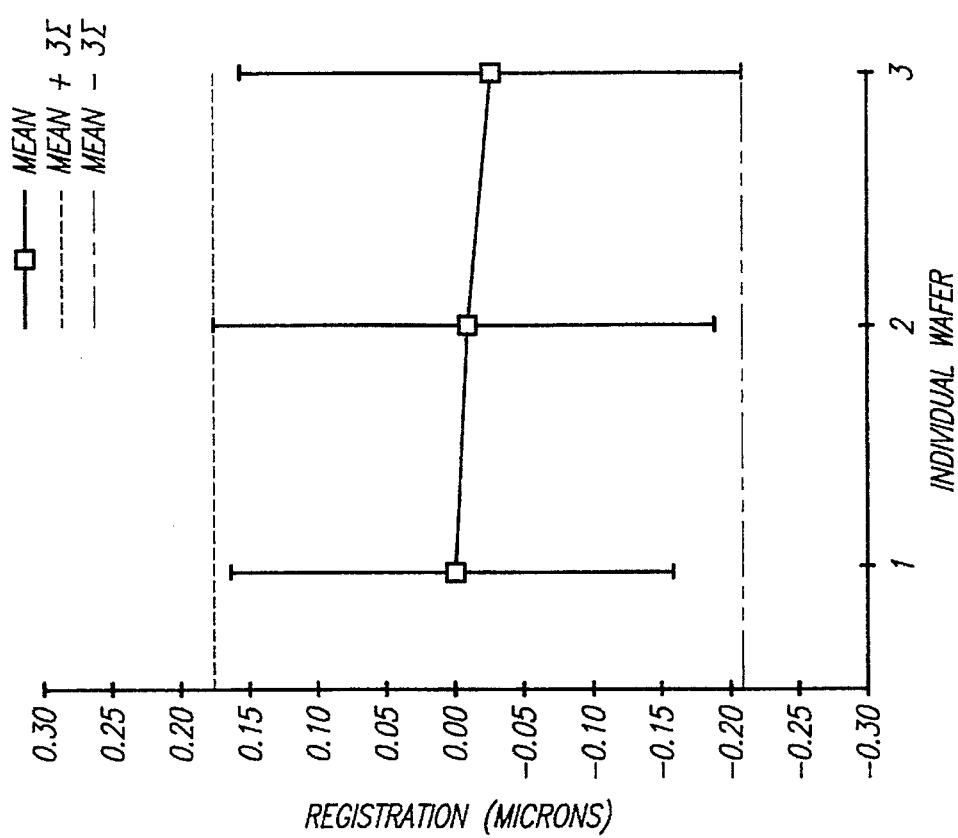
FIG. 7a  OPTIMIZED LSA

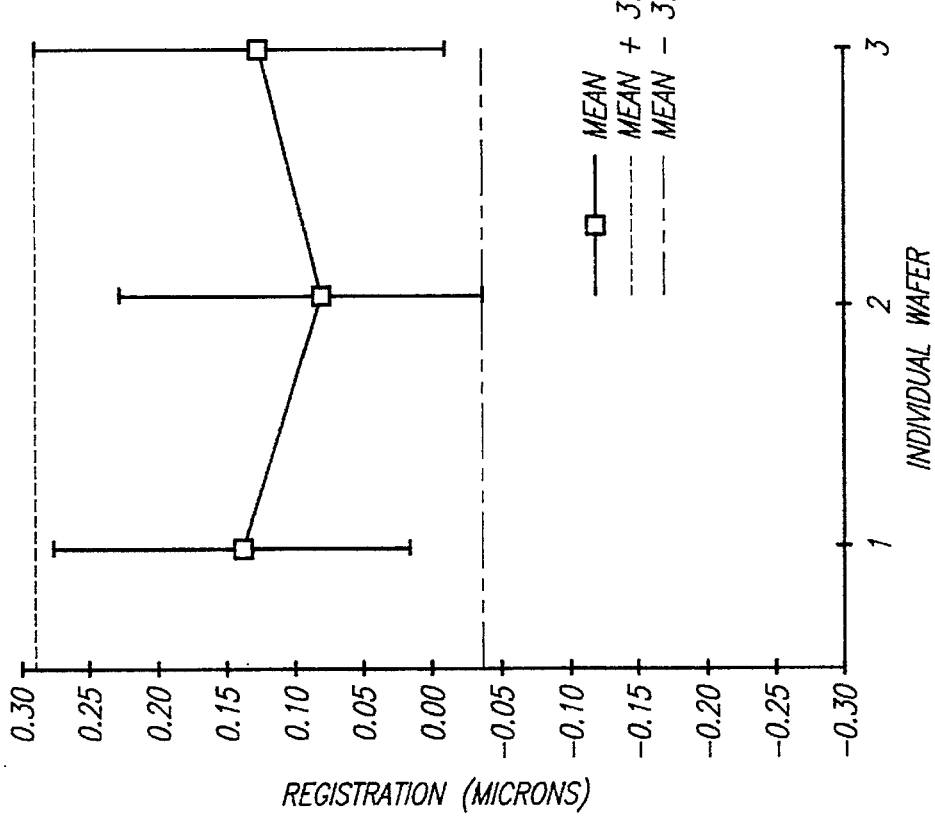
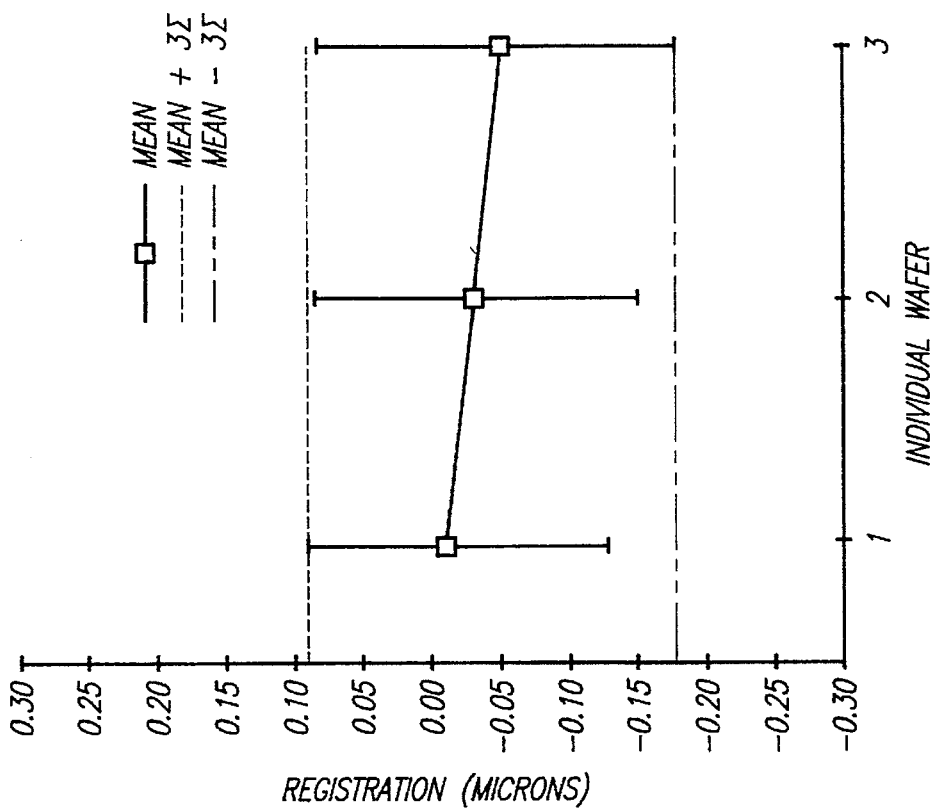

INTEGRATED CIRCUIT TEST RETICLE AND ALIGNMENT MARK OPTIMIZATION METHOD

CROSS REFERENCE TO RELATED APPLICATION

This application discloses subject matter common to U.S. patent application Ser. No. 08/025,202, filed Mar. 2, 1993, now U.S. Pat. No. 5,329,334, issued Jul. 12, 1994.

BACKGROUND OF THE INVENTION

Field of the Invention

The present invention relates to semiconductor integrated circuits and methods for integrated circuit manufacture. More particularly, the present invention relates to a test reticle and alignment mark optimization method for precision alignment of various integrated circuit process layers.

Description of the Related Art

Semiconductor integrated circuits undergo a variety of processing steps during manufacture, such as masking, resist coat, etching, and deposition. In many of these steps, material is overlayed or removed from the existing layer at specific locations in order to form the desired elements of the integrated circuit. Proper alignment of the various process layers is therefore critical. The shrinking dimensions of modern integrated circuits require increasingly stringent overlay alignment accuracy. If the proper alignment tolerance is not achieved, a large number device defects can result.

A waferstepper is typically used to align a semiconductor wafer during the various process steps. The waferstepper uses one of a number of commercially available techniques to generate alignment signals which indicate position relative to the wafer. The alignment signals are typically produced by optical measurement of alignment marks placed at appropriate locations on the wafer. A reticle is used to place the appropriately sized and shaped marks on a particular wafer process layer such that the marks can be readily identified by the waferstepper in subsequent processing steps. The reticle consists of a pattern which can be etched into the wafer using optical photolithography. Commonly used alignment mark types include Laser Step Alignment ("LSA"), Field Image Alignment ("FIA"), Laser Interferometric Alignment ("LIA"), Global Alignment Mark ("GAM"), and Global Alignment Mark LSA ("GAMLSA"), all developed by Nikon, and the Canon 6 Bar. Under current practice, a given test reticle will include only a single alignment mark type, even though wafersteppers can typically respond to a variety of alignment mark types. FIG. 1 illustrates two exemplary LSA alignment mark patterns for a Nikon waferstepper. The patterns consist of seven rows 10, 22 and seven columns 11, 23 of rectangles 12, 24.

The quality of the alignment marks is dependent upon how well the marks can be accurately translated into electrical signals understood by the waferstepper, which is a function of alignment mark size and shape. For example, in the LSA marks shown in FIG. 1, the quality of the alignment signal produced varies considerably depending upon the size of the elements making up the marks. In the Nikon waferstepper, a laser beam scans across the marks, and the diffracted light is detected to produce displays 14, 26 which consist of seven peaks 16, 28 indicative of position relative to the marks. In FIG. 1(a), the LSA mark shown produced the display 14 of seven peaks 16. The peaks shown are significantly clearer than the corresponding peaks 28 in display 26 of FIG. 1(b), produced in response to a laser scan of the mark including the larger rectangles 24. Use of the alignment signals in display 26 could lead to significant misalignment and thereby numerous device defects. It is therefore important that the parameters of an alignment mark be optimized for a particular application.

Registration is used to measure the accuracy of a process layer alignment performed using an alignment mark. Registration involves comparing the position of a subsequent layer to that of an existing layer by overlaying a distinct pattern on a matching pattern previously formed on the existing layer. The deviation in position of the overlay from the original provides a measure of accuracy of the alignment. Currently available registration structures include box-in-box, visual verniers, Automatic Measurement System ("AMS") and Canomap, each of which uses a different type of structure or pattern for comparison.

Under current practice, optimization of an alignment mark involves testing mark sizes and shapes by subsequent registration of test wafers to verify the accuracy of an alignment performed using the mark. One existing method to optimize an alignment mark uses a waferstepper test reticle with a single type of alignment mark to generate a first process layer, followed by printing the second layer resist pattern, and then performing registration on an overlay in both X and Y directions. The mark which results in the best registration reading is chosen as the optimal mark. However, this and other similar techniques have a number of disadvantages. The measurement results do not provide information as to the position of the alignment marks within acceptable process performance windows. A full array of alignment marks and registration overlays are not available to test. Standard overlay patterns for certain types of common registration techniques, such as box-in-box registration, are not available. Furthermore, previous layer process variations which may effect overlay are not taken into account in the measurements. In effect, none of the currently available techniques determine whether a particular alignment mark is indeed optimal.

In addition, in order to get overlay registration measurements from different alignment mark sizes, the test wafers would need to be stripped, respun and re-exposed several times, which could potentially alter the film surface and thereby affect-alignment results. In order to optimize other types of alignment marks, a different set of test wafers would have to be generated using a different test reticle. Furthermore, the test reticles do not include the capability for orthogonal measurements, which means that measurement results are considerably more difficult to model mathematically. These drawbacks limit the achievable alignment accuracy, and result in significantly increased manufacturing costs and greater likelihood of device defects.

As is apparent from the above, there presently is a need for an improved test reticle and alignment mark optimization method which permits the use of a wide variety of alignment marks and registration overlay structures using a single test reticle and one set of test wafers. Previous layer process variations should be taken into account, and a window of acceptable alignment mark sizes produced. The capability for orthogonal measurements should be provided, thereby simplifying statistical analysis for determining the truly optimal mark size ranges for a given application. The test reticle and method should provide a suitable standard for optimal alignment mark optimization in many applications. Furthermore, the test reticle and method should be compatible with existing waferstepper alignment equipment and techniques.

SUMMARY OF THE INVENTION

The present invention provides a test reticle and alignment mark optimization method for aligning processing layers during semiconductor integrated circuit manufacture. The present invention is based upon measuring, quantifying and modelling alignment signal quality as a function of alignment mark size. One aspect of the present invention consists of a test reticle comprising a plurality of alignment mark groups, each group including a particular type of alignment mark in one or more predetermined sizes; and registration means incorporating one or more registration structures.

In accordance with another aspect of the invention an alignment mark optimization method is provided which is particularly well-suited for use with the test reticle of the present invention. The alignment mark optimization method involves the steps of determining an initial expected range of alignment mark sizes on the test reticle which are suitable for a particular application; applying the test reticle pattern to one or more test wafers; further processing the test wafers; measuring the alignment signals produced by scanning the alignment marks in the initial expected range; quantifying the alignment signal quality; and fitting the quantified alignment signal quality to a statistical model to determine a range of optimal alignment mark dimensions.

As a feature of the present invention, a wide range of different alignment mark sizes and registration overlay patterns are provided on a single test reticle. The alignment mark sizes on the test reticle are orthogonally related such that statistical modelling to determine the range of optimal alignment mark sizes is considerably simplified. A window of acceptable alignment mark sizes can also be readily determined using the statistical data.

As another feature of the present invention, fewer test wafer samples are required to determine the optimal alignment mark size. With the test reticle and method of the present invention it is possible to verify the optimal alignment mark size using a single set of test wafers. Furthermore, various types of alignment marks may be optimized using one set of wafers. The optimal mark sizes can thus be quickly and efficiently determined. An archive of test wafers incorporating optimum mark sizes can be maintained to provide a baseline reference for subsequent processing.

As an additional feature of the present invention, the process variations which may influence overlay registration are taken into account in determining the optimal mark. The optimal alignment mark size determined is thus relatively insensitive to previous layer process variations.

As a further feature of the present invention, the test reticle and method can be used with most existing waferstepper alignment equipment and techniques, thus providing a much needed alignment optimization standard without the substantial expense of new stepper equipment.

The above-discussed features and attendant advantages of the present invention will become better understood by reference to the following detailed description of the preferred embodiments and the accompanying drawings.

BRIEF DESCRIPTION OF THE DRAWINGS

FIG. 7 shows the improvements in terms of reduced registration variance produced using LSA marks optimized in accordance with the method of the present invention as applied to the exemplary tungsten-plugged stack structure of FIG. 4.

FIG. 8 shows the improvements in terms of reduced registration variance produced using FIA marks optimized in accordance with the method of the present invention as applied to the exemplary tungsten-plugged stack structure of FIG. 4.

DETAILED DESCRIPTION OF THE PREFERRED EMBODIMENT

The test reticle and alignment mark optimization technique of the present invention rapidly and efficiently determine optimal mark size by evaluating the alignment signal quality as seen by the waferstepper. As was discussed above, the alignment signal quality can vary considerably as a function of the size and shape of the mark. In order to quantify alignment signal quality, a measurement metric has been developed in accordance with the present invention. The metric involves a systematic analysis and rating of the alignment signals based upon a number of alignment signal parameters. For a Nikon waferstepper, several criteria which define a good alignment signal include the absence of the following: 1) different amplitude peaks; 2) wide peaks; 3) asymmetric peaks; 4) different shaped peaks; 5) peaks outside the acceptable amplitude range 6) shoulders; and 7) background noise. In addition, narrow based peaks are preferable to wide based peaks.

Figure 1:
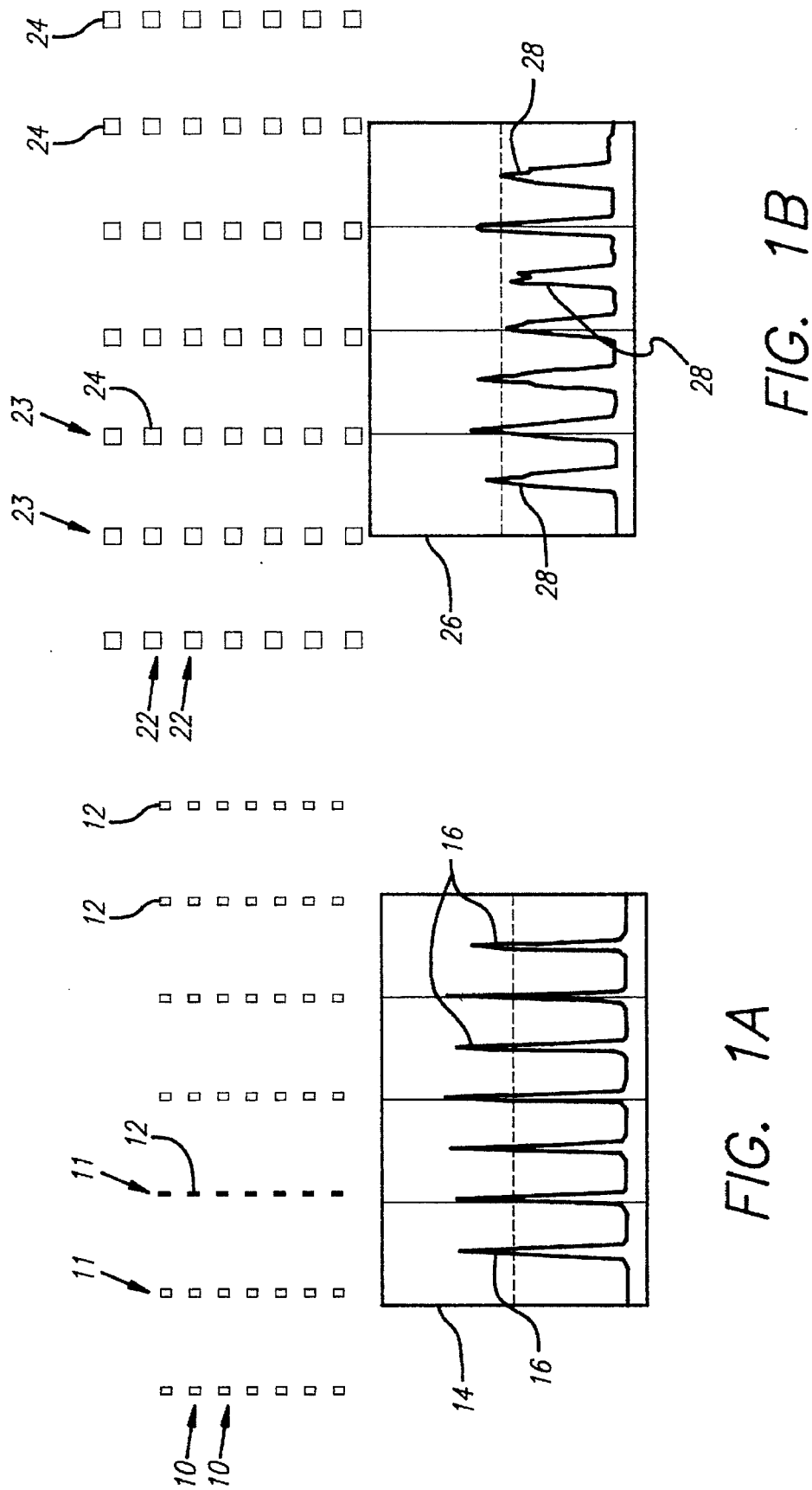
FIG. 1 shows two exemplary LSA alignment marks and the alignment signals produced from a laser scan of the exemplary LSA marks.

The peaks 28 of alignment signal display 26 shown in FIG. 1(b) illustrate a poor alignment signal having many of the above undesirable characteristics. The peaks 16 of display 14 in FIG. 1(a), on the other hand, represent a good alignment signal. The present invention quantifies alignment signal quality using as a metric a rating system on a scale of 1.0 to 5.0, with 1.0 corresponding to a good alignment signal, such as that in FIG. 1(a), and 5.0 corresponding to a poor alignment signal such as that in FIG. 1(b). The remaining ratings incorporate varying degrees of the above undesirable characteristics. For example, a signal rated 2.0 may include narrow based peaks as in FIG. 1(a) but significantly larger variation in amplitude from peak to peak. A signal rated 3.0 might include broad based peaks of relatively constant amplitude but with wide or asymmetric amplitude peaks outside the amplitude range. A signal rated 4.0 might include broad based peaks with significant amplitude variation and pronounced shoulders. The worst rated signal, 5.0, includes a combination of most or all of these undesirable characteristics, as shown in FIG. 1(b). This signal quality metric is applied to quantify alignment signal quality in the determination of optimal mark size as will be described in greater detail below.

Figure 2:
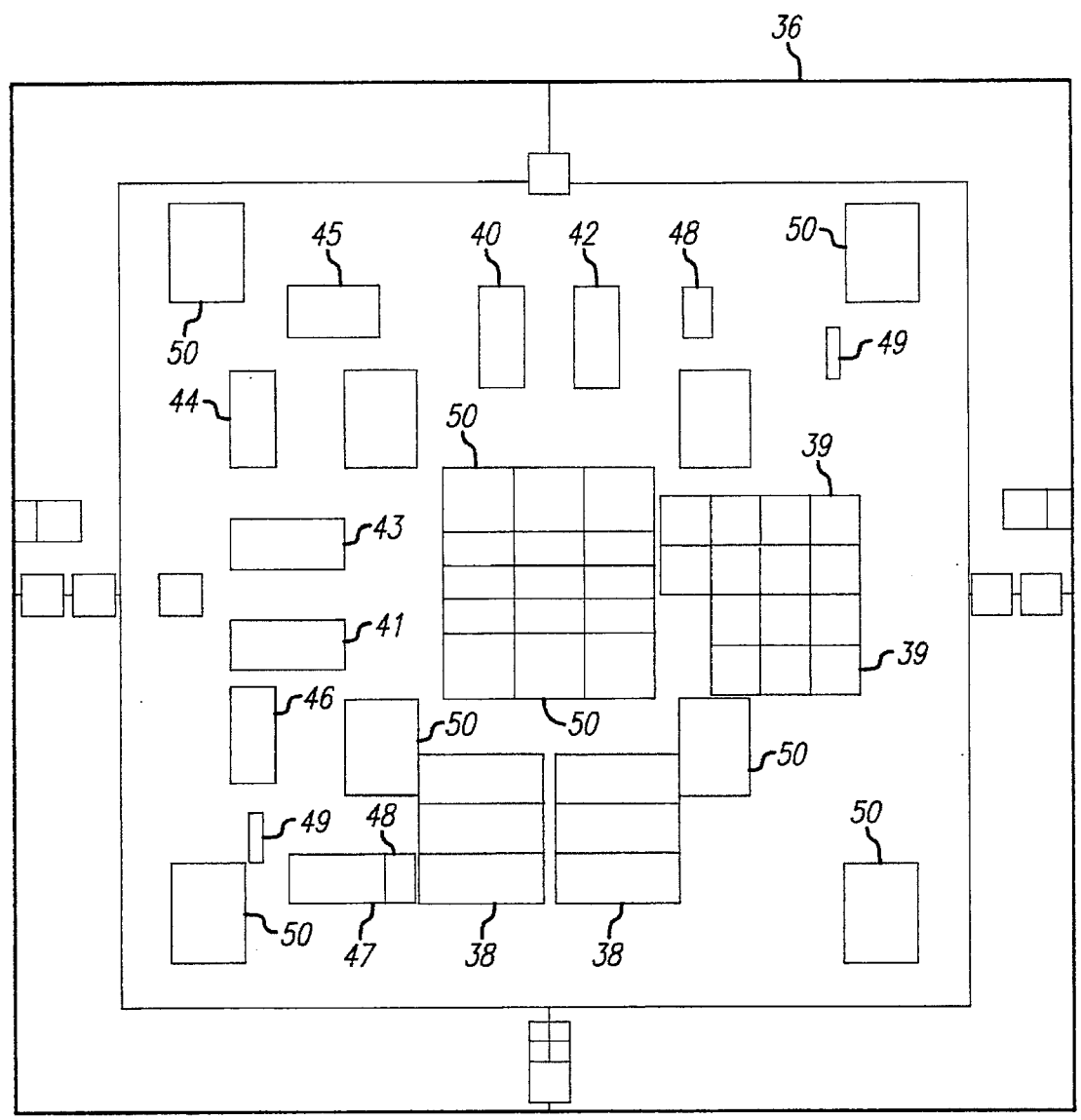
FIG. 2 is a block diagram of a preferred embodiment of the test reticle of the present invention.

The alignment mark signals are typically generated via a laser scan of an alignment mark placed on the process layer using a test reticle. A preferred embodiment of the test reticle of the present invention is shown in FIG. 2. The test reticle 36 includes most of the known alignment mark types and registration structures. The alignment mark types on reticle 36 include 1) LSA 38, 39; 2) FIA 40, 41; 3) LIA 42, 43; 4) GAM 44, 45; 5) GAMLSA 46, 47; and 6) CANON 6 Bar 48, 49. For each of these types, alignment mark size variations were orthogonally designed in both positive and negative polarities. Each exemplary alignment mark type therefore includes an X component and a Y component, as shown in FIG. 2. The orthogonal alignment mark design permits simplified statistical analysis. Most common alignment mark types, and various sizes of each type, are present on the reticle 36. Each group labelled in FIG. 2 includes a variety of sizes of one alignment mark type. For example, one LSA alignment mark group 39 might include 50 different combinations of LSA mark sizes. Each alignment mark in the group 39 will vary in length and width over a predetermined range. The predetermined range is typically based upon a vendor recommended nominal value. For LSA marks the length and width of the individual rectangular elements of each mark will vary over a range of about 1.0 to 6.0 microns. The exemplary reticle 36 as a whole contains several hundred different alignment marks of various types and sizes. It should be noted that the arrangement shown in FIG. 2 is exemplary only and that additional groups of alignment marks could be included and arranged in many different combinations.

Figure 3:
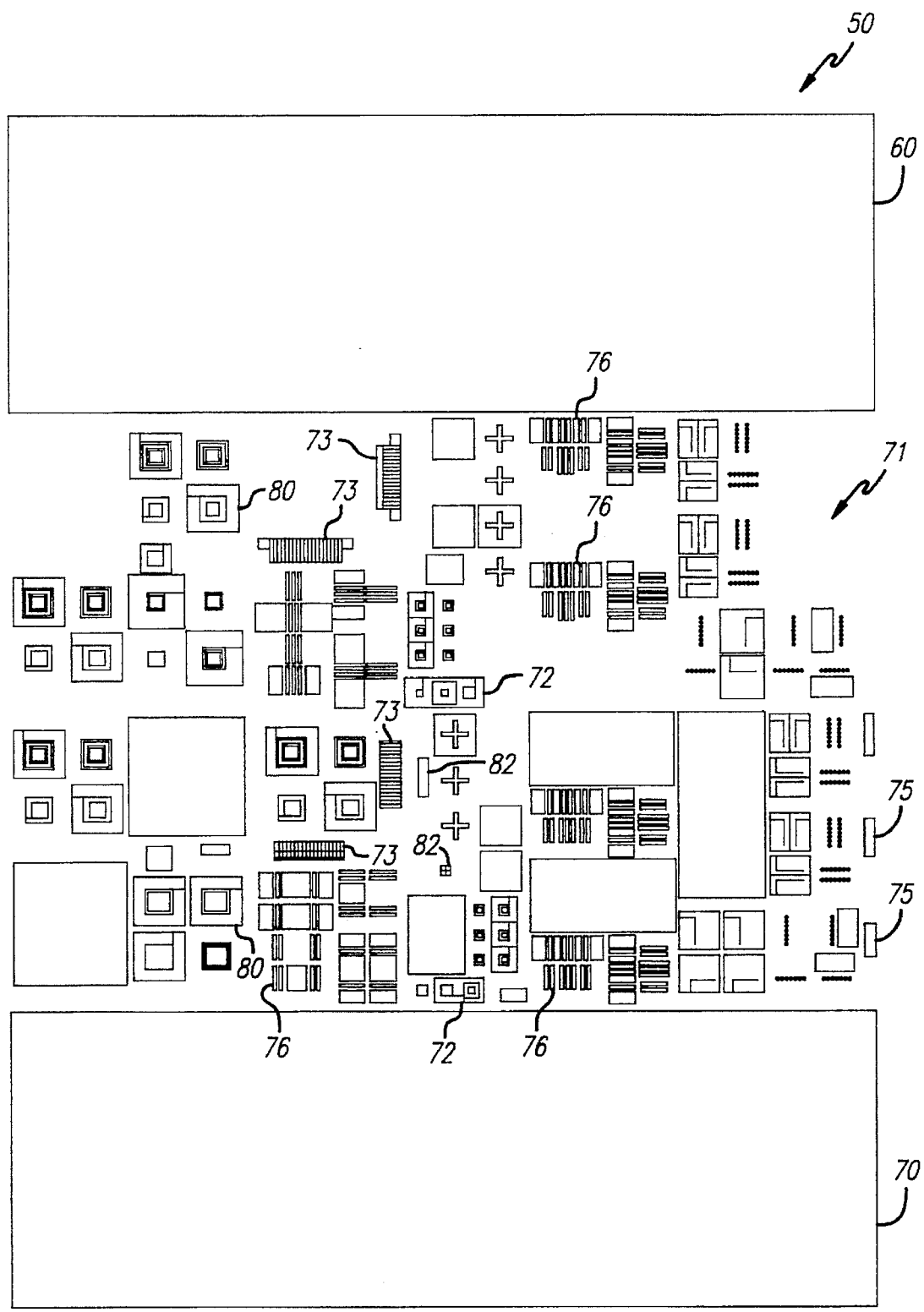
FIG. 3 is a detailed view of an exemplary registration means contained within the test reticle of FIG. 2.

The test reticle 36 further includes registration means. In the embodiment of FIG. 2 this registration means comprises a number of metrology cells 50 distributed throughout the reticle 36. Each metrology cell 50 includes one or more different metrology or registration structures. In a preferred embodiment each metrology cell 50 should include a variety of common registration structures. FIG. 3 shows a detailed diagram of the registration structures included in an exemplary metrology cell 50. The metrology cell 50 also includes upper protective area 60 and lower protective area 70 in which no structures are located. The protective areas 60, 70 serve to protect previously printed structures during subsequent registration. Within the central portion 71 of metrology cell 50 the following registration structures are located: 1) box-in-box 72; 2) verniers 73; 3) LSA AMS 75; 4) FIA AMS 76; 5) Canomap (Canon AMS) 80; and 6) XY 2I 82. Each of these registration structures in metrology cell 50 includes designed in offsets at about +/-0.2 microns, resist on resist design, resist on etched feature design, and etched feature on etched feature design. Only an exemplary structure of each type is labeled in FIG. 3. Again, it should be emphasized that the arrangement shown in FIG. 3 is exemplary only, and that many different arrangements or structures can be used to provide a suitable registration means.

Figure 4:
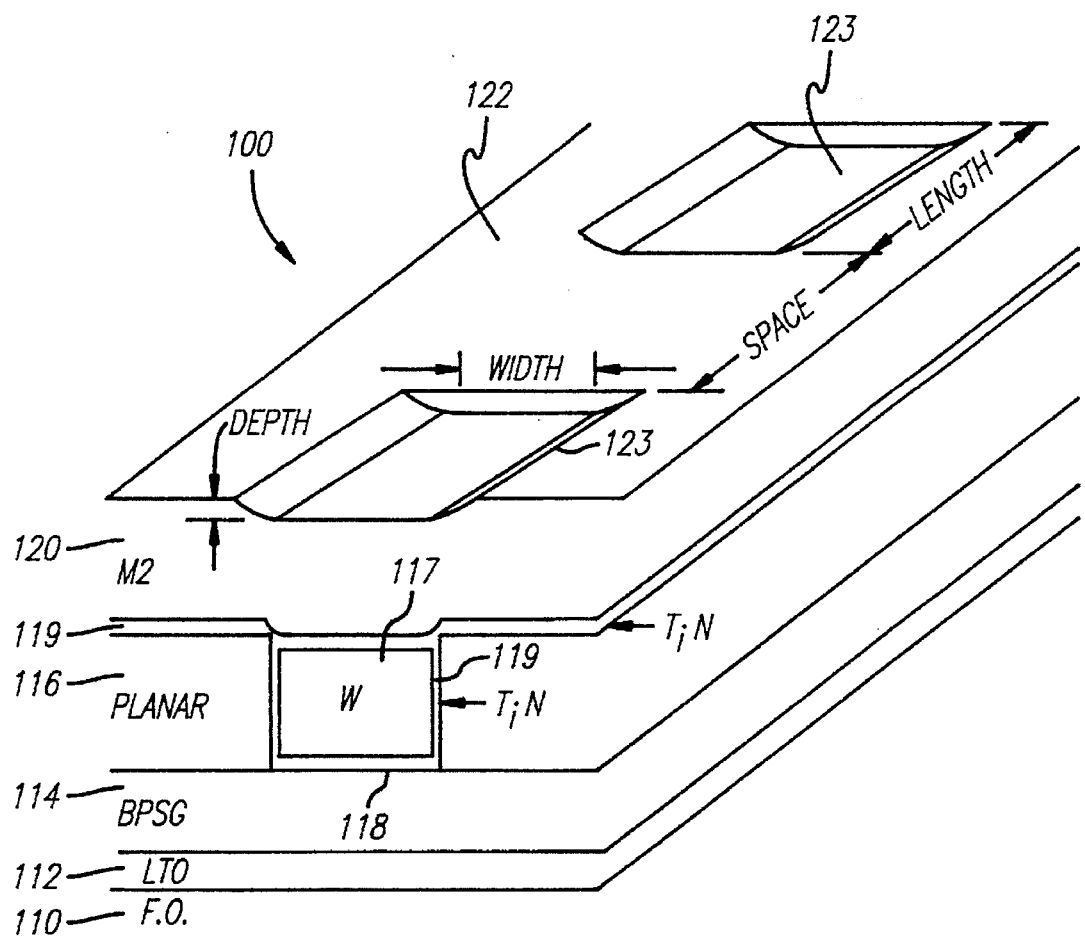
FIG. 4 shows a portion of an exemplary integrated circuit having a tungsten-plugged stack structure with a portion of an LSA alignment mark etched thereon.

The above-described test reticle is used in conjunction with the method of the present invention in the following manner. Initially, a plurality of test wafer substrates are generated to simulate the integrated circuit topography and thin film stack. One exemplary integrated circuit topology and film stack are shown in FIG. 4. A portion of an exemplary stack 100 of the test wafer shown in FIG. 4 includes a field oxide 110, a low temperature oxide 112, a layer of borophosphosilica glass (BPSG) 114 as a dielectric, and a planar interlayer dielectric 116. The interlayer dielectric 116 includes a via 118 which is filled as shown with a tungsten plug 117. The tungsten plug 117 within via 118 is surrounded by a layer of TiN 119 which also covers the entire planar interlayer dielectric 116. A metal layer 120 is deposited over the layer of TiN 119. A wide variety of alternative integrated circuit structures could also be used in conjunction with the present invention.

The test reticle 36 as described above was then used to pattern the exemplary test wafers described above to create the various types and sizes of alignment marks. In FIG. 4 a portion of an exemplary alignment mark is shown as formed on surface 122 of metal layer 120 using a portion of the LSA marks 38, 39 of test reticle 36. Two exemplary LSA alignment marks 123 are shown, each having a length, width and depth and separated by a space. These parameters influence the alignment signal quality produced by a laser scan of the mark. Each of the rectangles 123 can be considered one of the elements 12 or 24 of the 7 row by 7 column LSA marks shown in FIG. 1. The test wafer would also include the other types of alignment marks previously described.

It should be noted that important determinants of alignment signal quality such as mark length, width, depth and spacing can be influenced by process variation. For example, in the exemplary stack 100 of FIG. 4, process variation could affect the depth of the via 118 as well as the percent tungsten fill, and thereby influence alignment signal quality. These process variations are expected since upper and lower process limits for the degree of interlayer dielectric planarization and via over etch affect the depth of the via and the degree of tungsten etchback affects the tungsten fill percentage. Process variations such as these in the exemplary tungsten plugged stack of FIG. 4 can reduce the alignment signal quality by one or two quantified levels on the quality scale described above. It is therefore important to take process variations such as these into account in the optimization method.

An initial expected range for each of the orthogonal alignment mark dimensions was then determined and input into a commercially available statistical modeling program known as RS1. The RS1 software package is available from BBN Software Products Corporation of Cambridge, Mass. The D-optimal cubic design feature of the RS1 software package is then used to generate the minimum number of alignment mark size combinations which will provide a desired level of accuracy in modeling alignment signal quality. Alternative statistical modelling software packages could also be used. The initial expected range for the test wafers described above was determined for LSA marks to be various sizes in the range of 1.0 to 6.0 microns for both length and width. The initial expected range was determined using a distribution of values about the nominal vendor recommended dimensions. For example, the modelling software can reduce the initial expected range of about 50 size combinations for the exemplary group 39 of LSA marks to about 12 required size combinations. The software is thus capable of taking the values which define the initial expected range and producing from them the minimal number of values which will adequately define the range for subsequent modelling. The result is that many fewer alignment mark sizes need to be analyzed, leading to a significant time and cost savings. Similar analysis is applied to determine the initial expected range and the minimal number of size combinations for the other types of marks used.

Figure 5:
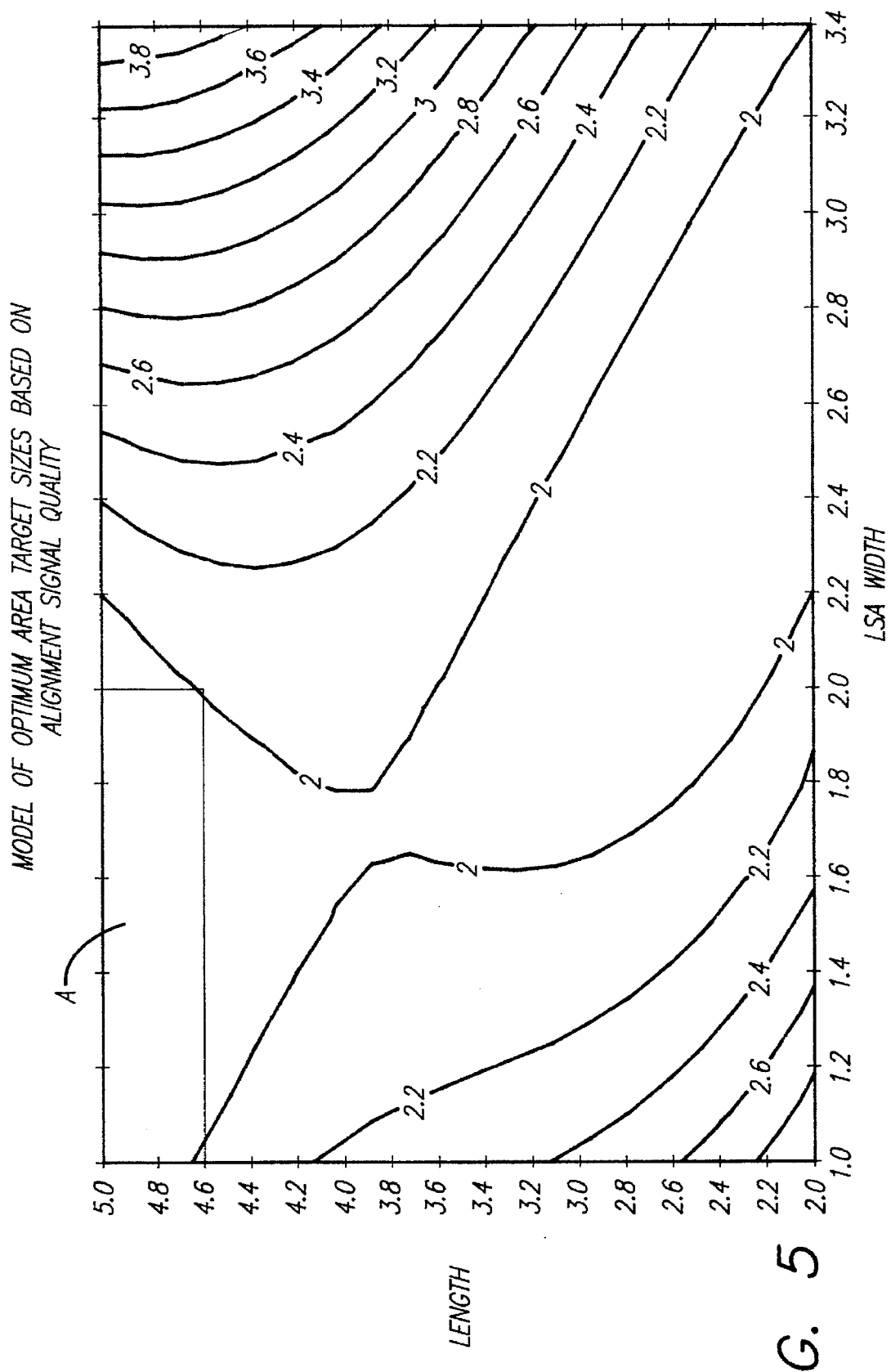
FIG. 5 is a graph of an exemplary contour map generated in accordance with the method of the present invention showing alignment signal quality as a function of LSA alignment mark width and length.

Signals produced from scans of the minimal number of alignment mark size combinations were then measured and quantified using the 1.0 to 5.0 rating scale. The quality value associated with each size of alignment signal is entered into the RS1 software package. The user interacts with the software package to extend these measured signal quality values to produce a model of expected signal quality for all possible combinations of alignment mark sizes. After the user plugs in the measured alignment signal quality, the software will generate an initial model. Typically, the user will need to determine how well the measurement points have been modelled and determine if any points should be eliminated from consideration in order to improve the model. The software should be re-run to generate a new model if any of the initial measurement points are discarded for any reason, such as obvious measurement error. Several iterations are typically required to produce an adequate model. The modelling software output is in the form of a contour map which shows what particular level of signal quality can be expected for any given mark size in the area of interest. An exemplary contour map generated in accordance with this technique as applied to LSA marks is shown in FIG. 5. The contour map shows contours of uniform signal quality level as a function of LSA mark length and width. A portion of the contour defines a window of optimal alignment signal quality as indicated by shaded area A in FIG. 5. Marks with dimensions in the shaded area A had a signal quality rating of 2.0 or better. It should be noted that the nominal target signal sizes, without this optimization, had a signal quality rating of only slightly better than 3.0. A similar contour could be generated for each of the alignment mark types of interest in a particular application. Alignment mark sizes in the optimal area A were checked on the test wafers to confirm that the alignment signal quality rating was indeed less than 2.0 for mark sizes in the optimal window A, in order to confirm the results of the contour generating model.

Figure 6:
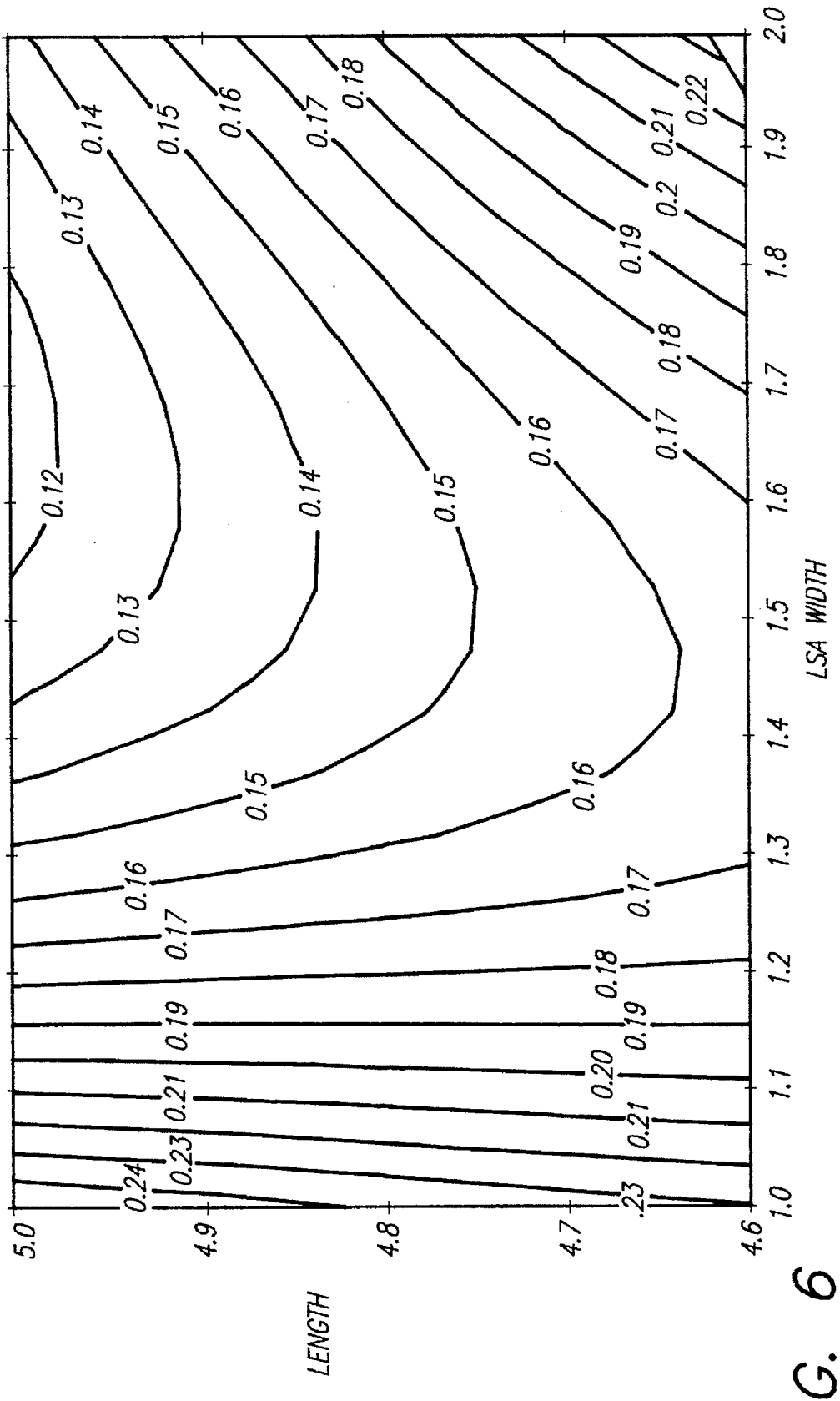
FIG. 6 is a graph of an exemplary contour map generated in accordance with the method of the present invention showing registration measurements as a function of LSA alignment mark width and length.

One additional step which may be performed to verify the optimization results involves aligning the test wafers and performing registration. Ten die were chosen for die by die alignment. Registration data was collected using the box-in-box registration structures 72 of metrology cell 50. The box-in-box registration was performed using an Interactive Video System ("IVS") measurement metrology tool. Alternative registration structures and measurement techniques could also be used. The three sigma statistical registration variation for the minimal number of alignment mark size combinations on the ten test wafers was calculated and input into the RS1 software model. A registration contour was generated based upon a statistical model to extend the calculated registration three sigma variance to all possible mark size combinations within the optimal shaded area A of FIG. 5. An exemplary registration contour for LSA marks is shown in FIG. 6. Note that the contour of FIG. 6 corresponds only to registration values for the LSA mark dimensions falling within the shaded area A in FIG. 5. The results show a registration variance of less than 0.24 for all values within the optimal window. It should be noted that these three sigma contours are not directly comparable to the three sigma values which will be discussed in conjunction with FIGS. 7 and 8 since the values in FIG. 6 are based upon a die by die alignment. The registration values in FIGS. 7 and 8 are based upon an enhanced global alignment technique which will in general result in improved registration values.

The mark dimensions within the optimal alignment signal rating window A will exhibit reduced registration variance. Within the optimal window, specific alignment mark sizes can be selected which exhibit the best registration values. For example, FIG. 6 can be used to select LSA mark dimensions having an expected registration three sigma value as low as 0.12. In addition, process variation is taken into account in determining the optimal mark since the determination is based upon signals received by the stepper. The optimal alignment mark size determined is thus relatively insensitive to previous layer process variations. The alignment mark sizes within the optimal window can then be used for future alignment in order to reduce alignment error. The test wafers including these alignment mark sizes can be archived to provide a baseline reference for subsequent processing.

The benefits of the above described optimization method can be seen in the following examples which apply optimal alignment mark sizes determined in accordance with the above described method to a set of product wafers. In the first example, several product wafers having the structure shown in FIG. 4 were printed at the via mask level using a prior reticle having only nominal LSA mark sizes thereon, while other product wafers were printed with a new reticle including LSA mark dimensions falling within the optimal size window described above. Registration was performed after alignment of the metal layer 120 using the via alignment marks printed at the via mask level. The registration results for both the optimized and nominal LSA alignment mark sizes is as shown in FIG. 7. The graph shows the overall mean plus three sigma registration improvement of the optimized mark over the nominal mark. FIG. 7(a) shows a total registration variation across three product wafers of about 0.38 microns (+0.17 and −0.21) for the optimized LSA mark size. FIG. 7(b) shows a total registration variation across three wafers of 0.47 microns (+0.22 and −0.25). The total registration variance improvement for the optimized LSA marks is therefore about 0.09 microns.

In a second example, the test reticle and method of the present invention were applied to determine optimal FIA mark sizes for wafers having the general structure shown in FIG. 4. It should be noted that the optimization FIA marks can be carried out on the same set of wafers as was used for the optimization of the LSA mark example, since both LSA and FIA marks, as well as a variety of other marks, are simultaneously available on the test reticle of the present invention. One half of the wafers were previously printed with the nominal size FIA marks and the other half were printed with the optimized size FIA marks in the manner described in conjunction with the previous example. Alignment of product wafers with the nominal FIA marks as well as wafers with the optimized FIA marks was performed in accordance with the method of the present invention. The FIA mark registration three sigma variation results are as shown in FIG. 8. FIG. 8(a) shows a total registration variation across three product wafers of about 0.27 microns (+0.09 and −0.18) for the optimized FIA mark size. FIG. 8(b) shows a total registration variation across three wafers of 0.33 microns (+0.29 and −0.04). The total registration variance improvement for the optimized FIA marks is therefore about 0.06 microns. In the foregoing LSA and FIA examples, the registration variance improvement can be attributed to a variety of factors including a more consistent mean offset from wafer to wafer as well as a tighter within wafer variance distribution. These reduced variance factors are a result of the improvement in alignment signal quality resulting from using optimized alignment mark sizes.

Although the foregoing detailed description is directed to certain preferred embodiments of the present invention, it should be understood that this is by way of example and not limitation. For example, the test results discussed above optimize LSA and FIA mark size as applied to the exemplary tungsten-plugged stack structure of FIG. 4. However, the method and test reticle of the present invention can be readily applied to a wide variety of other integrated circuit structures using many different types of alignment marks and registration techniques. Many alternative embodiments will be apparent to one skilled in the art, and the present invention is thus limited only by the appended claims.

What is claimed is:

1. A method of fabricating a semiconductor integrated circuit including a plurality of overlying process layers, comprising the steps of:

(a) providing a test reticle having a pattern including a plurality of groups of different types of alignment marks, with each group including a plurality of different sizes of said alignment marks respectively;

(b) applying the test reticle to form said pattern on a test wafer;

(c) sensing a selected group of said alignment marks of said pattern on the test wafer to determine an optimal size for said alignment marks thereof; and (d) fabricating said integrated circuit using alignment marks of said selected group and said optimal size to align said overlying process layers.

2. A method as in claim 1, in which step (a) comprises providing said pattern as further including a registration structure.

3. A method as in claim 2, in which step (c) comprises performing a registration on the test wafer using said registration structure.

4. A method as in claim 1, in which step (c) comprises the substeps of:

(e) optoelectronically scanning said pattern on the test wafer to produce electrical signals corresponding to said alignment marks; and (f) analyzing said electrical signals using a predetermined criteria to determine said optimal size.

5. A method as in claim 1, further comprising the step, performed between steps (b) and (c), of:

(e) subjecting the test wafer to an additional processing step.

6. A method as in claim 1, in which step (a) comprises providing the test reticle such that said alignment marks are formed in an orthogonal pattern.

7. A method as in claim 1, in which step (a) comprises providing the test reticle such that said alignment marks are formed in a non-orthogonal pattern.

8. A semiconductor integrated circuit including a plurality of overlying process layers, fabricated by a method comprising the steps of:

(a) providing a test reticle having a pattern including a plurality of groups of different types of alignment marks, with each group including a plurality of different sizes of said alignment marks respectively;

(b) applying the test reticle to form said pattern on a test wafer;

(c) sensing a selected group of said alignment marks of said pattern on the test wafer to determine an optimal size for said alignment marks thereof; and (d) fabricating said integrated circuit using alignment marks of said selected group and said optimal size to align said overlying process layers.

9. A method as in claim 8, in which step (a) comprises providing said pattern as further including a registration structure.

10. A method as in claim 9, in which step (c) comprises performing a registration on the test wafer using said registration structure.

11. A method as in claim 8, in which step (c) comprises the substeps of:

(e) optoelectronically scanning said pattern on the test wafer to produce electrical signals corresponding to said alignment marks; and (f) analyzing said electrical signals using a predetermined criteria to determine said optimal size.

12. A method as in claim 8, further comprising the step, performed between steps (b) and (c), of:

(e) subjecting the test wafer to an additional processing step.

13. A method as in claim 8, in which step (a) comprises providing the test reticle such that said alignment marks are formed in an orthogonal pattern.

14. A method as in claim 8, in which step (a) comprises providing the test reticle such that said alignment marks are formed in a non-orthogonal pattern.

15. An archive wafer fabricated by a method comprising the steps of:

(a) providing a test reticle having a pattern including a plurality of groups of different types of alignment marks, with each group including a plurality of different sizes of said alignment marks respectively;

(b) applying the test reticle to form said pattern on a test wafer;

(c) sensing a selected group of said alignment marks of said pattern on the test wafer to determine an optimal size for said alignment marks thereof; and (d) forming alignment marks of said selected group and said optimal size on the archive wafer.

16. An archive wafer as in claim 15, in which step (a) comprises providing said pattern as further including a registration structure.

17. An archive wafer as in claim 16, in which step (c) comprises performing a registration on the test wafer using said registration structure.

18. An archive wafer as in claim 15, in which step (c) comprises the substeps of:

(e) optoelectronically scanning said pattern on the test wafer to produce electrical signals corresponding to said alignment marks; and (f) analyzing said electrical signals using a predetermined criteria to determine said optimal size.

19. An archive wafer as in claim 15, further comprising the step, performed between steps (b) and (c), of:

(e) subjecting the test wafer to an additional processing step.

20. An archive wafer as in claim 15, in which step (a) comprises providing the test reticle such that said alignment marks are formed in an orthogonal pattern.

21. An archive wafer as in claim 15, in which step (a) comprises providing the test reticle such that said alignment marks are formed in a non-orthogonal pattern.

* * * * *